(12) United States Patent
Leeser

(10) Patent No.: US 9,916,995 B2
(45) Date of Patent: Mar. 13, 2018

(54) COMPACT SUBSTRATE PROCESSING TOOL WITH MULTI-STATION PROCESSING AND PRE-PROCESSING AND/OR POST-PROCESSING STATIONS

(71) Applicant: LAM RESEARCH CORPORATION, Fremont, CA (US)

(72) Inventor: Karl Leeser, Lake Oswego, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 343 days.

(21) Appl. No.: 14/628,342

(22) Filed: Feb. 23, 2015

(65) Prior Publication Data

US 2015/0240360 A1    Aug. 27, 2015

Related U.S. Application Data

(60) Provisional application No. 61/943,729, filed on Feb. 24, 2014.

(51) Int. Cl.
| | |
|---|---|
| C23C 16/455 | (2006.01) |
| C23C 16/44 | (2006.01) |
| H01L 21/677 | (2006.01) |
| C23C 16/50 | (2006.01) |
| H01L 21/67 | (2006.01) |

(52) U.S. Cl.
CPC .... *H01L 21/67196* (2013.01); *H01L 21/6719* (2013.01); *H01L 21/67703* (2013.01)

(58) Field of Classification Search
CPC ......... C23C 16/45525; H01L 21/67703; H01L 21/67751
See application file for complete search history.

(56) References Cited

U.S. PATENT DOCUMENTS

2003/0035705 A1* 2/2003 Johnson ................ C23C 14/566
                                                                            414/217

* cited by examiner

*Primary Examiner* — Parviz Hassanzadeh
*Assistant Examiner* — Nathan K Ford

(57) ABSTRACT

A substrate processing tool includes N substrate processing stations arranged in a first transfer plane around a central cavity, where N is an integer greater than one. At least one of the N substrate processing stations is configured to process the substrate. M substrate processing stations are arranged in a second transfer plane around the central cavity, where M is an integer greater than one. The second transfer plane is arranged parallel to and above the first transfer plane. An upper tool portion includes the M substrate processing stations and a first portion of the N substrate processing stations. A rotatable lower tool portion rotates relative to the upper tool portion. A second portion of the N substrate processing stations rotates with the rotatable lower tool portion.

29 Claims, 3 Drawing Sheets

COMPACT SUBSTRATE PROCESSING TOOL WITH MULTI-STATION PROCESSING AND PRE-PROCESSING AND/OR POST-PROCESSING STATIONS

CROSS-REFERENCE TO RELATED APPLICATIONS

This application claims the benefit of U.S. Provisional Application No. 61/943,729, filed on Feb. 24, 2014. The entire disclosure of the application referenced above is incorporated herein by reference.

FIELD

The present disclosure relates to substrate processing tools, and more particularly to semiconductor processing tools.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Substrate processing systems such as semiconductor processing systems may be used to deposit or etch film layers, metal layers or other types of layers on a substrate such as a semiconductor wafer. The substrate processing system may include one or more processing stations. In a substrate processing system, substrate handling can have a significant impact on cost and throughput. To increase throughput and reduce cost, the substrates need to be processed through different processing steps in the most efficient manner and with minimal or no contamination.

In some substrate processing systems, the substrates are moved from a substrate cassette to a reactor and then back to a substrate cassette or another location. To improve throughput and reduce substrate handling, a single reactor may include multiple, sequential processing stations. In this type of substrate processing system, the substrate is moved to the reactor, processed sequentially in the processing stations and then moved to a substrate cassette or another location. This processing arrangement tends to increase throughput by reducing substrate handling.

While substrate processing tools have been developed to provide high throughput and low material cost, these substrate processing tools do not typically allow pre- or post-processing options on the same tool. Some tools combine multiple station, sequential processing (MSSP) with single station modules such as pre-clean or pre-treatment modules. However, the material cost for these tools tends to be higher because many subsystems of the tool are replicated for each module. Moreover, since the modules sprawl around a centralized wafer handler, the overall footprint is relatively large.

SUMMARY

A substrate processing tool includes N substrate processing stations arranged in a first transfer plane around a central cavity, where N is an integer greater than one. At least one of the N substrate processing stations is configured to process the substrate. M substrate processing stations are arranged in a second transfer plane around the central cavity, where M is an integer greater than one. The second transfer plane is arranged parallel to and above the first transfer plane. An upper tool portion includes the M substrate processing stations and a first portion of the N substrate processing stations. A rotatable lower tool portion rotates relative to the upper tool portion. A second portion of the N substrate processing stations rotates with the rotatable lower tool portion.

In other features, the N substrate processing stations perform multi-station sequential processing (MSSP). The M substrate processing stations perform at least one of pre-processing and post-processing of the substrate. A robot is arranged in the central cavity and is configured to transfer substrates to at least one of the N processing stations in the first transfer plane and to at least one of the M substrate processing stations in the second transfer plane.

In other features, at least one of the M substrate processing stations performs a function selected from a group consisting of pre-clean, pre-treat, nucleation and buffering. The N substrate processing stations are arranged with equal angular offsets around the central cavity. The N substrate processing stations are arranged with irregular angular offsets around the central cavity. The M substrate processing stations in the second transfer plane are arranged above and staggered relative to the N substrate processing stations in the first transfer plane.

In other features, at least one of the N substrate processing stations is configured to perform at least one of atomic layer deposition (ALD), plasma-enhanced ALD (PEALD), chemical vapor deposition (CVD) and plasma-enhanced CVD (PECVD). Each of the N substrate processing stations includes a pedestal that moves with the rotatable lower tool portion. At least one of the N substrate processing stations includes a showerhead connected to the upper tool portion and a pedestal connected to the rotatable lower tool portion.

In other features, bearing surfaces are arranged between the upper tool portion and the rotatable lower tool portion. The bearing surfaces comprise gas bearing surfaces and a differential pumping device. A passage in the upper tool portion connects at least one of the N substrate processing stations to the central cavity.

In other features, M passages in the upper tool portion connect the M substrate processing stations to the central cavity, respectively. An external passage to at least one of the M substrate processing stations allows external loading of a substrate into the at least one of the M substrate processing stations. The robot is configured to transfer substrates to each of the M substrate processing stations in the second transfer plane.

In other features, a loadlock is connected to the central cavity. A robot is configured to transfer substrates from a cassette to the loadlock and from the loadlock to the central cavity. The substrate comprises a semiconductor wafer. The bearing surfaces comprise ferrofluidic seals and a differential pumping device.

In other features, the at least one of the N substrate processing stations is configured to perform deposition of film on the substrate. The substrate comprises a semiconductor wafer.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

Figure 1:
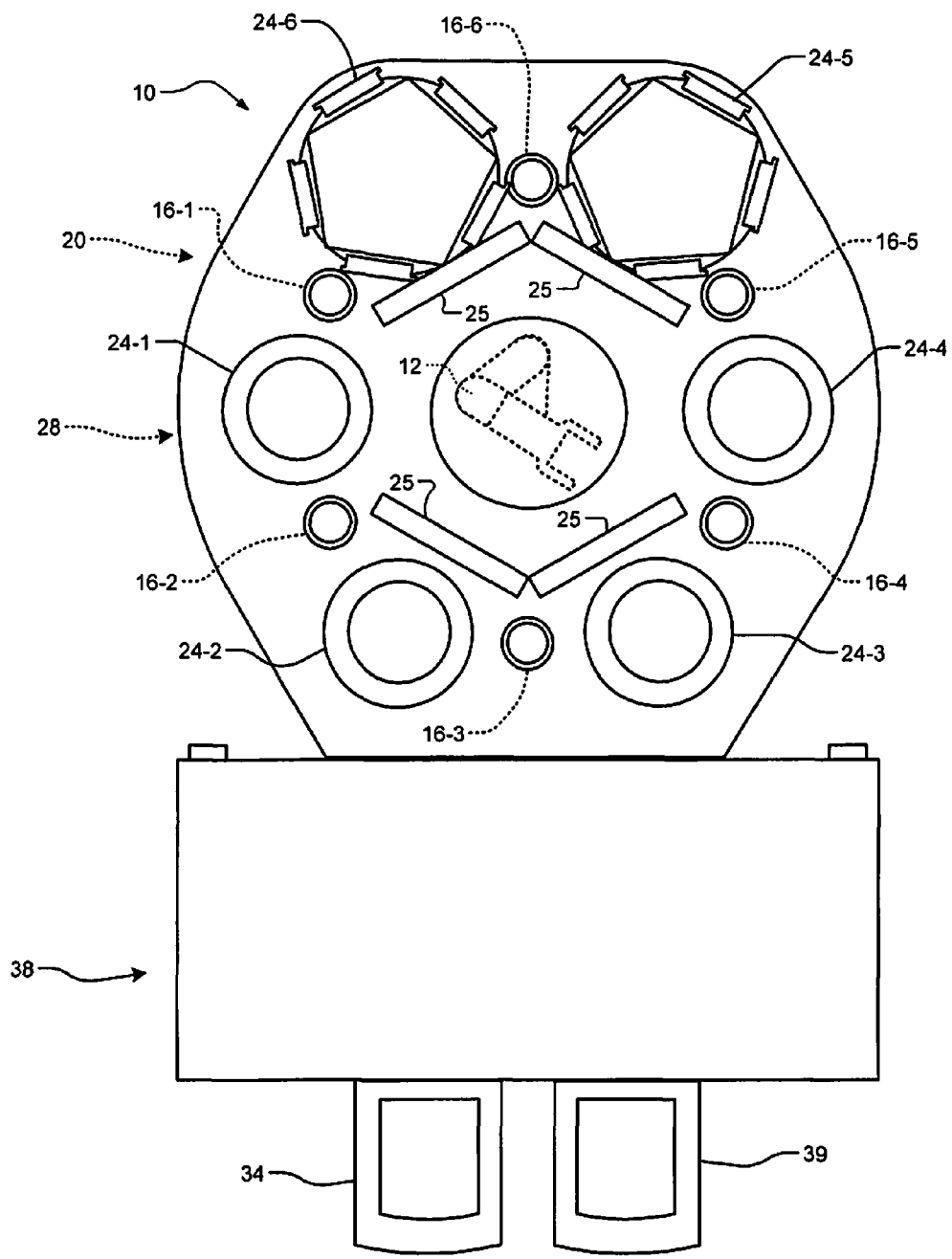
FIG. 1 is a plan view illustrating a substrate processing tool according to the present disclosure.

Referring now to FIG. 1, a substrate processing tool 10 according to the present disclosure is shown. The substrate processing tool 10 includes a robot 12 arranged in a central location. The robot 12 may be operated at vacuum.

Figure 2:
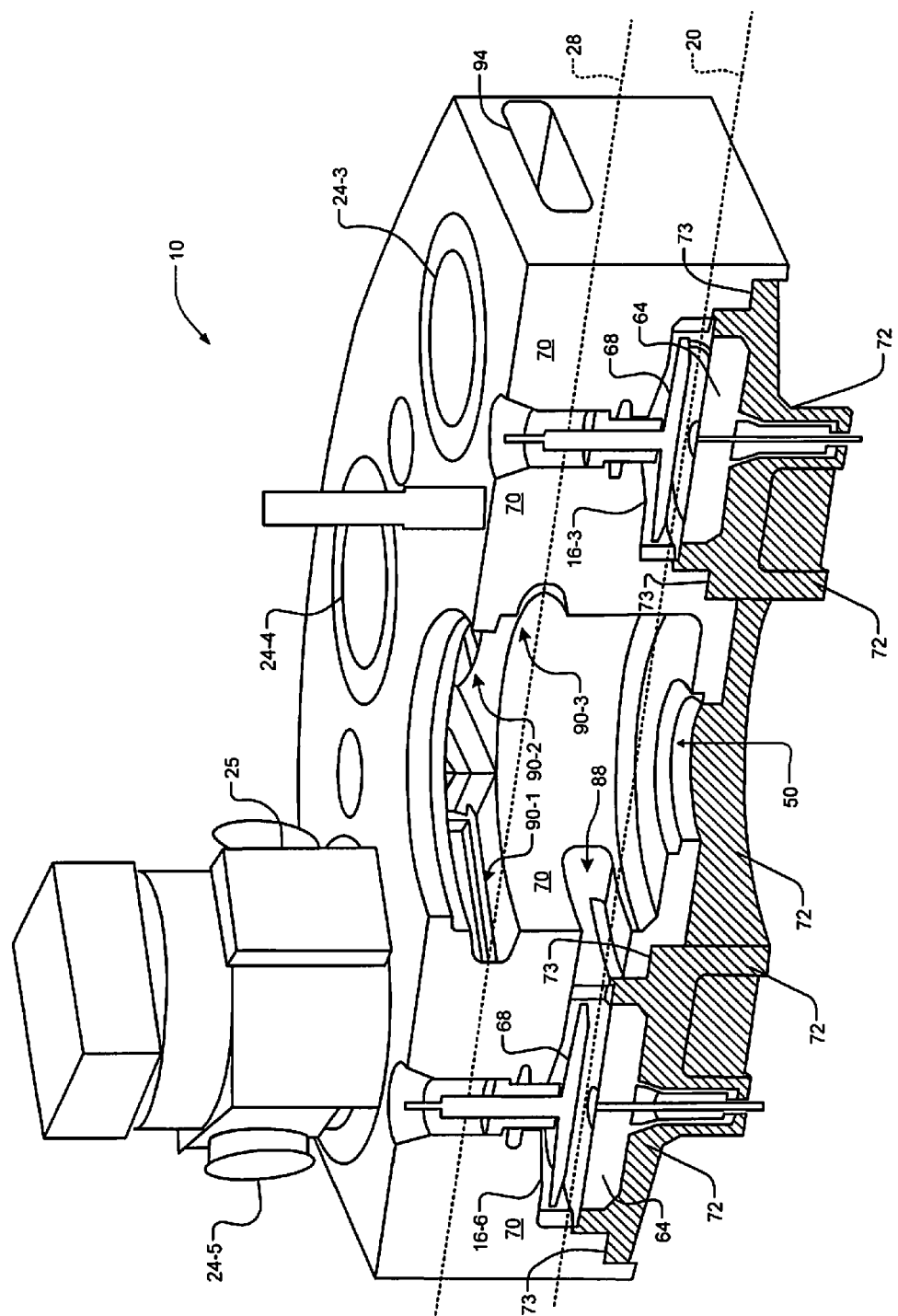
FIG. 2 is a perspective view illustrating the substrate processing tool of FIG. 1 in further detail.

Multi-station, sequential processing (MSSP) may be performed via a plurality of stations 16-1, 16-2, . . . , and 16-M (collectively stations 16) (where M is an integer greater than one) arranged around the robot 12 in a lower transfer plane 20 (also see FIG. 2). Additional, single substrate stations 24-1, 24-2, . . . , and 24-N (collectively stations 24) (where N is an integer greater than one) are located in an upper transfer plane 28 (also see FIG. 2) that is arranged above the lower transfer plane 20. One or more of the stations 24 may be isolated from ambient of the transfer chamber 50 and/or other ones of the stations using an isolation valve 25 such as a slit valve. The stations 24 may or may not be isolated.

The stations 16 may be arranged around a center of the substrate processing tool 10 with an equal or irregular angular offset. The stations 24 also may be arranged around a center of the substrate processing tool 10 with an equal or irregular angular offset. The stations 16 may be located between the stations 24 and may have an angular offset with respect to the stations 24. While N and M are equal to 6 in FIG. 1, N and M may be set to other values. Examples of stations 24 may include preclean, pretreat, nucleation, and buffer, although other types of stations may be used. The stations 24 may be used to perform pre- and/or post-processing on the substrates. The upper stations 24 and the lower stations 16 include support systems such as gas delivery, pumping, instrumentation and/or plasma power systems that may be shared or dedicated.

The substrates may be initially located in a cassette 34. A robot and load lock generally identified at 38 may be used to move the substrates from the cassette 34 to the substrate processing tool 10. When processing is complete, the robot and load lock 38 may return the substrates to the cassette 34 and/or another cassette 39. The lower and upper transfer planes 20 and 28, respectively, are separated by a relatively small distance due to spatial nesting of station hardware in a vertical direction.

Figure 3:
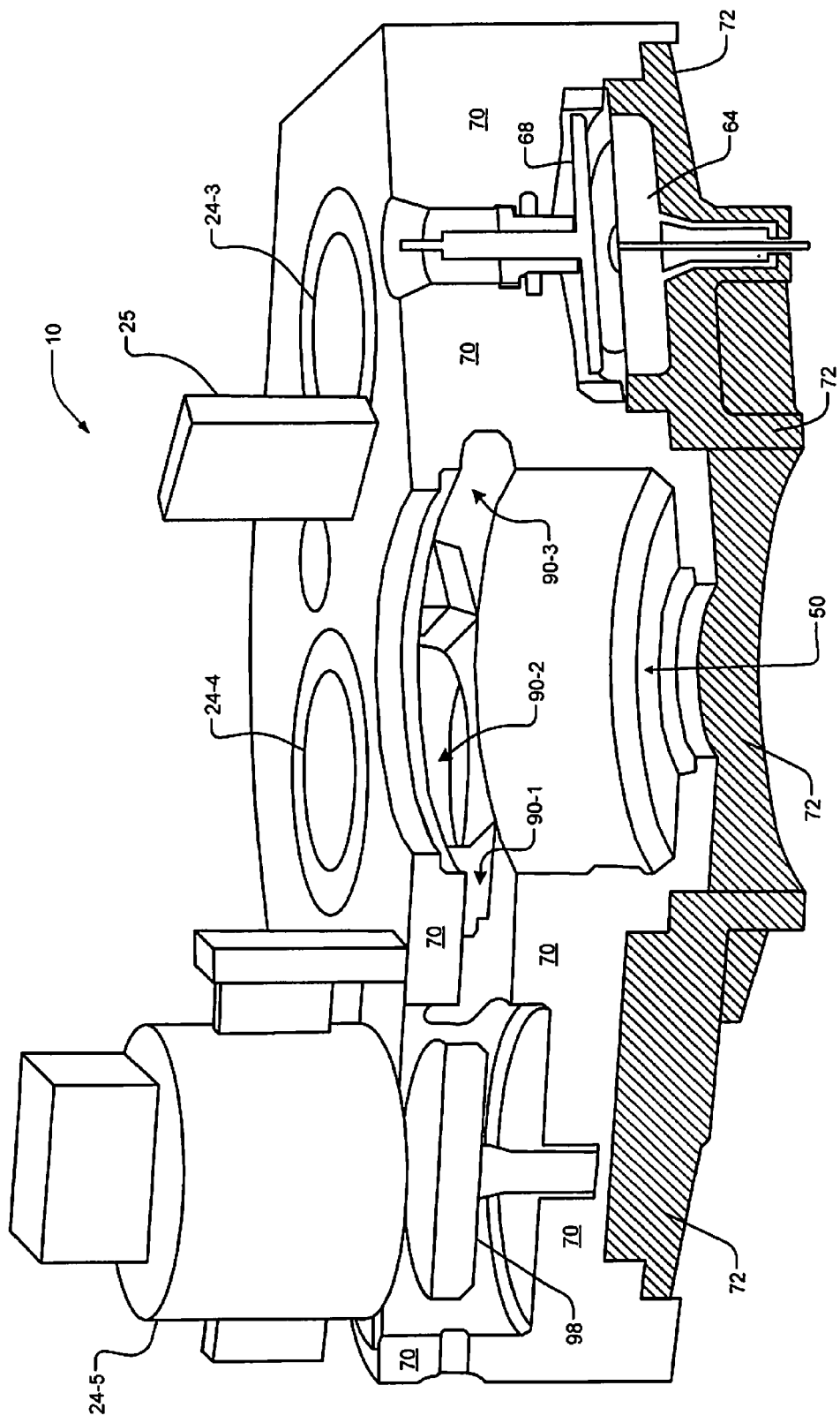
FIG. 3 is another perspective view illustrating the substrate processing tool of FIGS. 1 and 2 in further detail.

Referring now to FIGS. 2 and 3, the lower transfer plane 20 and the upper transfer plane 28 of the substrate processing tool 10 are shown in more detail. The robot 12 may be arranged in a vertical cavity 50 defined in a central portion of the substrate processing tool 10.

The stations 16 are arranged in the lower transfer plane 20. In some implementations, one or more of the stations 16 may include a pedestal 64 and a showerhead 68, although other types of stations 16 may be used. The lower transfer plane 20 further includes a stationary portion 70 and a rotatable portion 72. A bearing surface may be arranged at one or more locations 73 between the stationary portion 70 and the rotatable portion 72 to allow sealing and/or relative rotation.

In some applications, the bearing surfaces 73 may include a gas bearing utilizing a pressurized inert gas arrangement both on inside (inner diameter for a circular transport) and outside (outer diameter) with a differential pumping device across the gas bearing. The differential pumping device may include multiple plenums. The plenums include grooves that are connected to different pumps at different levels of vacuum to form a seal. Alternately, ferrofluidic seals with differential pumping may be used.

The rotatable portion 72 rotates relative to the stationary portion 70 and acts as a carousel assembly. If used, the pedestal 64 in the stations 16 may be attached to the rotatable portion 72 of the lower transfer plane 20. If used, the showerhead 68 in the stations 16 may be attached to the stationary portion 70 of the lower transfer plane 20.

Substrates can be loaded from the robot 12 into the stations 16 in the lower transfer plane 20 through one or more passages 88 that connect to the vertical cavity 50. Processing may be performed on the substrates and then the rotatable portion 72 (the carousel assembly) can be rotated to a next one of the stations 16 in the lower transfer plane 20. When the substrate has been processed in the stations 16, the substrate can be moved to one or more of the stations 24 in the upper transfer plane 28 for post-processing as needed using the robot 12 or to one of the cassettes 34 or 39. Likewise, pre-processing can be performed in the stations 24 prior to MSSP in the stations 16.

Substrates can be loaded from the robot 12 into the stations 24 in the upper transfer plane 28 through corresponding passages 90-1, 90-2, . . . , and 90-T (where T is an integer) that connect to the vertical cavity 50. On or more external passages 94 may allow loading directly into the stations 16 and/or 24. In FIG. 3, the station 24-5 is shown to include a pedestal 98.

Components of the substrate processing tool 10 are strategically located in three dimensions to enable nesting of key components. This allows a "double decker" architecture that is useful for large substrate diameters (such as but not limited to 450 mm) with only a minimal vertical displacement. The substrate processing tool 10 also has improved footprint utilization, which is especially important for large substrate diameters. By minimizing the number of discrete chamber bodies, the substrate processing tool 10 also tends to have an improved cost structure.

As non-limiting examples, the substrate processing system may be used with processes such as atomic layer deposition (ALD), plasma-enhanced ALD (PEALD), chemical vapor deposition (CVD), plasma-enhanced CVD (PECVD), and other types of processes. Similarly designed substrate processing systems are also used to process glass plates for applications such as photovoltaics, flat panel displays, and electrochromic windows.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. A substrate processing tool, comprising:
   N substrate processing stations arranged in a first transfer plane around a central cavity, where N is an integer greater than one, and wherein each of the N substrate processing stations includes a pedestal and is configured to process one or more of a plurality of substrates;
   M substrate processing stations arranged in a second transfer plane around the central cavity, where M is an integer greater than one, and wherein the second transfer plane is arranged parallel to and above the first transfer plane;
   an upper tool portion including the M substrate processing stations and a first portion of the N substrate processing stations; and
   a rotatable lower tool portion that rotates relative to the upper tool portion, wherein the rotatable lower tool portion includes a second portion of the N substrate processing stations, such that the second portion rotates with the rotatable lower tool portion and about the central cavity, and wherein the second portion includes the pedestals of the N substrate processing stations.

2. The substrate processing tool of claim 1, wherein the N substrate processing stations perform multi-station sequential processing (MSSP).

3. The substrate processing tool of claim 1, wherein the M substrate processing stations perform at least one of pre-processing and post-processing of the plurality of substrates.

4. The substrate processing tool of claim 3, wherein at least one of the M substrate processing stations performs a function selected from a group consisting of pre-clean, pre-treat, nucleation and buffering.

5. The substrate processing tool of claim 1, further comprising a robot arranged in the central cavity and configured to transfer the plurality of substrates to at least one of the N substrate processing stations in the first transfer plane and to at least one of the M substrate processing stations in the second transfer plane.

6. The substrate processing tool of claim 5, wherein the robot is configured to transfer the plurality of substrates to each of the M substrate processing stations in the second transfer plane.

7. The substrate processing tool of claim 1, wherein the N substrate processing stations are arranged with equal angular offsets around the central cavity.

8. The substrate processing tool of claim 1, wherein the N substrate processing stations are arranged with irregular angular offsets around the central cavity.

9. The substrate processing tool of claim 1, wherein the M substrate processing stations in the second transfer plane are arranged above and staggered relative to the N substrate processing stations in the first transfer plane.

10. The substrate processing tool of claim 1, wherein at least one of the N substrate processing stations is configured to perform at least one of atomic layer deposition (ALD), plasma-enhanced ALD (PEALD), chemical vapor deposition (CVD) and plasma-enhanced CVD (PECVD).

11. The substrate processing tool of claim 1, wherein:
    at least one of the N substrate processing stations includes a showerhead connected to the upper tool portion; and
    the pedestal of the at least one of the N substrate processing stations is connected to the rotatable lower tool portion.

12. The substrate processing tool of claim 1, further comprising bearing surfaces arranged between the upper tool portion and the rotatable lower tool portion.

13. The substrate processing tool of claim 1, further comprising a passage in the upper tool portion connecting at least one of the N substrate processing stations to the central cavity.

14. The substrate processing tool of claim 1, further comprising M passages in the upper tool portion connecting the M substrate processing stations to the central cavity, respectively.

15. The substrate processing tool of claim 1, further comprising an external passage to at least one of the M substrate processing stations to allow external loading of the plurality of substrates into the at least one of the M substrate processing stations.

16. The substrate processing tool of claim 1, further comprising:
    a loadlock connected to the central cavity; and
    a robot configured to transfer the plurality of substrates from a cassette to the loadlock and from the loadlock to the central cavity.

17. The substrate processing tool of claim 1, wherein the at least one of the plurality of substrates comprises a semiconductor wafer.

18. The substrate processing tool of claim 1, wherein at least one of the N substrate processing stations is configured to perform deposition of film on one or more of the plurality of substrates.

19. The substrate processing tool of claim 1, wherein the upper tool portion is in a fixed position relative to the central cavity.

20. The substrate processing tool of claim 1, wherein:
    the first portion of the N substrate processing stations includes a plurality of showerheads; and
    each of the N substrate processing stations includes a respective one of the showerheads.

21. The substrate processing tool of claim 20, wherein the upper tool portion is in a fixed position relative to the central cavity.

22. A substrate processing tool, comprising:
    N substrate processing stations including pedestals and arranged in a first transfer plane around a central cavity, where N is an integer greater than one, and wherein the N substrate processing stations are configured to process one or more of a plurality of substrates;

M substrate processing stations arranged in a second transfer plane around the central cavity, where M is an integer greater than one, and wherein the second transfer plane is arranged parallel to and above the first transfer plane;

an upper tool portion including the M substrate processing stations and a first portion of the N substrate processing stations; and a rotatable lower tool portion that rotates relative to the upper tool portion and about a vertical centerline of the central cavity, wherein the rotatable lower tool portion includes a second portion of the N substrate processing stations, such that the second portion rotates with the rotatable lower tool portion and about the vertical centerline of the central cavity, and wherein the second portion includes the pedestals of the N substrate processing stations.

23. A substrate processing tool, comprising:

N substrate processing stations arranged in a first transfer plane around a central cavity, where N is an integer greater than one, wherein each of the N substrate processing stations includes a pedestal and is configured to perform a deposition process on one or more of a plurality of substrates;

M substrate processing stations arranged in a second transfer plane around the central cavity, where M is an integer greater than one, wherein each of the M substrate processing stations is configured to perform at least one of a pre-cleaning process, a pre-treatment process, or a nucleation process on one or more of the plurality of substrates, and wherein the second transfer plane is arranged parallel to and above the first transfer plane, an upper tool portion including the M substrate processing stations and a first portion of the N substrate processing stations; and a rotatable lower tool portion that rotates relative to the upper tool portion, wherein the rotatable lower tool portion includes a second portion of the N substrate processing stations, such that the second portion rotates with the rotatable lower tool portion, and wherein the second portion includes the pedestals of the N substrate processing stations.

24. A substrate processing tool, comprising:

N substrate processing stations arranged in a first transfer plane around a central cavity, where N is an integer greater than one, and wherein the N substrate processing stations comprise respective pedestals and are configured to process a plurality of substrates;

M substrate processing stations arranged in a second transfer plane around the central cavity, where M is an integer greater than one, and wherein the second transfer plane is arranged parallel to and above the first transfer plane;

an upper tool portion including the M substrate processing stations and a first portion of the N substrate processing stations;

a rotatable lower tool portion that rotates relative to the upper tool portion, wherein the rotatable lower tool portion includes a second portion of the N substrate processing stations, such that the second portion rotates with the rotatable lower tool portion, and wherein the second portion includes the pedestals of the N substrate processing stations;

a first plurality of passages arranged in the first transfer plane and corresponding respectively to the N substrate processing stations; and a second plurality of passages arranged in the second transfer plane and corresponding respectively to the M substrate processing stations, wherein the second plurality of passages are distinct from the first plurality of passages, wherein each of the N substrate processing stations is configured to receive from the central cavity one or more of the plurality of substrates via a respective one of the first plurality of passages, and wherein each of the M substrate processing stations is configured to receive from the central cavity one or more of the plurality of substrates via a respective one of the second plurality of passages.

25. The substrate processing tool of claim 24, wherein portions of the second plurality of passages are arranged over portions of the first plurality of passages.

26. The substrate processing tool of claim 24, wherein a plurality of portions of the M substrate processing stations are disposed over corresponding portions of the N substrate processing stations.

27. The substrate processing tool of claim 24, wherein each of the N substrate processing stations is disposed beneath two of a plurality of portions of the M substrate processing stations.

28. A substrate processing tool, comprising:

N substrate processing stations including pedestals and arranged in a first transfer plane around a central cavity, where N is an integer greater than one, and wherein the N substrate processing stations are configured to process one or more of a plurality of substrates;

M substrate processing stations arranged in a second transfer plane around the central cavity, where M is an integer greater than one, and wherein the second transfer plane is arranged parallel to and above the first transfer plane;

an upper tool portion including the M substrate processing stations and a first portion of the N substrate processing stations;

a rotatable lower tool portion that rotates relative to the upper tool portion, wherein the rotatable lower tool portion includes a second portion of the N substrate processing stations, such that the second portion rotates with the rotatable lower tool portion, and wherein the second portion includes the pedestals of the N substrate processing stations; and a robot arranged in the central cavity and configured to
vertically move the one or more of the plurality of substrates from the N substrate processing stations up to a first passage of one of the M substrate processing stations, and
vertically move the one or more of the plurality of substrates from the one of the M substrate processing stations down to a second passage of the N substrate processing stations, wherein the second passage is distinct from and partially over the first passage.

29. The substrate processing tool of claim 28, wherein:
the robot is configured to vertically move the plurality of substrates between respective passages of the N substrate processing stations and the M substrate processing stations; and
the respective passages include the first passage and the second passage.

* * * * *